United States Patent
Cho et al.

(10) Patent No.: US 7,692,490 B2
(45) Date of Patent: Apr. 6, 2010

(54) POWER AMPLIFYING DEVICE HAVING LINEARIZER

(75) Inventors: Yun Hee Cho, Gyunggi-do (KR); Chul Soon Park, Daejeon (KR); Ji Hoon Kim, Daejeon (KR); Yun Hwi Park, Gyunggi-do (KR)

(73) Assignee: Samsung Electro-Mechanics Co., Ltd., Suwon, Gyunggi-Do (KR)

( * ) Notice: Subject to any disclaimer, the term of this patent is extended or adjusted under 35 U.S.C. 154(b) by 57 days.

(21) Appl. No.: 12/049,005

(22) Filed: Mar. 14, 2008

(65) Prior Publication Data

US 2008/0238553 A1  Oct. 2, 2008

(30) Foreign Application Priority Data

Mar. 29, 2007  (KR) .................... 10-2007-0030877

(51) Int. Cl.
    H03F 3/04  (2006.01)
(52) U.S. Cl. ...................................... 330/296
(58) Field of Classification Search ............ 330/51, 330/149, 296, 136
    See application file for complete search history.

(56) References Cited

U.S. PATENT DOCUMENTS 3,708,756 A  *  1/1973  Fajen .................. 330/296

6,492,869 B1  12/2002  Kuriyama et al.

FOREIGN PATENT DOCUMENTS

| KR | 10-2003-0096861 A | 12/2003 |
| KR | 10-2005-0057928 A | 6/2005 |

OTHER PUBLICATIONS

Korean Intellectual Property Office, Office Action mailed May 30, 2008.

* cited by examiner

Primary Examiner—Steven J Mottola
(74) Attorney, Agent, or Firm—Lowe Hauptman Ham & Berner

(57) ABSTRACT

There is provided a power amplifying device having a linearizer in which a bias circuit has an initial impedance set when initially operated, then the impedance is varied according to a level of an input signal and the input signal is amplified in a broad range from a low level region to a high level region, thereby improving linearity of an output signal. The power amplifying device including: an amplifying unit receiving a bias power source and amplifying an input signal; a bias unit varying the bias power source according to a set impedance to provide to the amplifying unit; and an impedance setting unit setting the impedance of the bias unit in response to a preset control voltage when the bias unit is initially operated and re-setting the impedance of the bias unit according to a level of the input signal of the amplifying unit after initial operation of the bias unit.

6 Claims, 10 Drawing Sheets

POWER AMPLIFYING DEVICE HAVING LINEARIZER

CROSS-REFERENCE TO RELATED APPLICATIONS

This application claims the priority of Korean Patent Application No. 2007-30877 filed on Mar. 29, 2007, in the Korean Intellectual Property Office, the disclosure of which is incorporated herein by reference.

BACKGROUND OF THE INVENTION

1. Field of the Invention

The present invention relates to a power amplifying device, and more particularly, to a power amplifying device having a linearizer, in which a bias circuit has an initial impedance set when initially operated, then the impedance is varied according to a level of an input signal and the input signal is amplified in a broad range from a low level region to a high level region, thereby improving linearity of an output signal.

2. Description of the Related Art

In general, a power amplifying device essentially employed in a wireless telecommunication system, when operating in a saturation region having nonlinear characteristics, experiences distortion in size and phase of an output signal due to the nonlinear characteristics, thereby generating signal distortion components. In consequence, this significantly degrades transmission performance of the telecommunication system.

To reduce these inter-modulation distortion components, the power amplifying device may linearly amplify an output while ensuring high linearity. The power amplifying device can perform linearization via a back-off method or by employing a bias structure using a linearizer.

First, when it comes to the back-off method, the power amplifying device, when used at a P1 dB band, i.e., a point where the output signal is 1 dB low from a saturation region, undergoes severe non-linearity, and thus the output of the power amplifying device is backed off from the P1 dB band to several dB. However, in this back-off method, the power amplifying device is operated in a several dB low region, which is not a maximum output region having maximum efficiency. This as a result considerably undermines efficiency of the power amplifying device.

Next, a description will be given of a method of employing a bias structure using a linearizer in a power amplifying device with reference to FIGS. 1A and 1B.

FIG. 1A is a circuit diagram illustrating an example of a conventional power amplifying device.

Referring to FIG. 1A, the conventional power amplifying device 10 includes a signal amplifying unit 11, a bias unit 12, a linearizing unit 13 and a current compensating unit 14. The signal amplifying unit 11 has a transistor amplifying an input signal RF IN in response to an operating power source (Vcc). The bias unit 12 has a transistor supplying a bias current to the signal amplifying unit 11. The linearizing unit 13 has a passive capacitor and the current compensating unit 14 compensates for a current supplied to the bias unit.

The transistor of the signal amplifying unit 11 receives the operating power sources and operates in response to the operating power source and then amplifies the input signal input signal (RF IN) fed through a base terminal. Here, the transistor of the bias unit 12 has an impedance lower than the transistor of the signal amplifying unit 11. Thus, in a case where the input signal is a high frequency signal, the input signal RF IN is fed to the transistor of the bias unit 12, thereby decreasing potential between a base and emitter of the transistor of the bias unit 12. This accordingly compensates for decrease in the base-emitter voltage of the transistor of the signal amplifying unit 11, thereby improving linearity of an output signal RF out.

The conventional power amplifying device 10 as described above is structured such that a passive capacitor of the linearizing unit 13 rectifies the input signal RF IN and generates an additional direct current (DC) in response to the input signal. Here, the passive capacitor has a capacitance fixed. Thus, in a case where the input signal RF IN has a low level, the fixed capacitance leads to a low impedance, thereby increasing current consumption and degrading efficiency. This also aggravates inter-modulation distortion.

FIG. 1B is a circuit diagram illustrating another example of a conventional power amplifying device.

Referring to FIG. 1B, the conventional power amplifying device 20 has a linearizing unit 23 structured differently from that of the power amplifying device 10 shown in FIG. 1A. The conventional linearizing unit 23 of the conventional power amplifying device 20 includes a reverse diode. The reverse diode supplies a dynamic impedance to a transistor of a bias unit 22 so that the input signal (RF IN) is less applied to the bias unit 22 in a low level region and the input signal is more applied to the bias unit 22 in a high level region. This as a result improves linearity of an output signal RF OUT generated from the amplified input signal.

Here, due to presence of equivalent capacitance in the low level region, a portion of the input signal (RF IN) is applied to the linearizing unit 23 via the bias unit 22, accordingly increasing current consumption, undermining efficiency and aggravating inter-modulation distortion.

SUMMARY OF THE INVENTION

An aspect of the present invention provides a power amplifying device, and more particularly, to a power amplifying device having a linearizer, in which a bias circuit has an initial impedance set when initially operated, then the impedance is varied according to a level of an input signal and the input signal is amplified in a broad range from a low level region to a high level region, thereby improving linearity of an output signal.

According to an aspect of the present invention, there is provided a power amplifying device having a linearizer including: an amplifying unit receiving a bias power source and amplifying an input signal; a bias unit varying the bias power source according to a set impedance to provide to the amplifying unit; and an impedance setting unit setting the impedance of the bias unit in response to a preset control voltage when the bias unit is initially operated and re-setting the impedance of the bias unit according to a level of the input signal of the amplifying unit after initial operation of the bias unit.

The power amplifying device may further include a current compensating unit supplying a preset current to the bias unit.

The amplifying unit may include at least one amplifying transistor having a base receiving the input signal and the bias power source, a collector receiving an operating power source and an emitter connected to a ground, the bias unit includes a bias transistor having a collector receiving a preset reference voltage, an emitter connected to the base of the amplifying transistor to supply the bias power source to the amplifying transistor, and a base connected to the current compensating unit, and the impedance setting unit includes a varactor diode having a cathode connected to the base of the bias transistor and an anode receiving the control voltage, the impedance setting unit setting the impedance applied to the base of the bias transistor.

The control voltage may be a voltage applying a reverse bias to the varactor diode.

The current compensating unit may include a plurality of transistors connected in series with one another between a reference voltage terminal and the ground.

The amplifying unit may include the plurality of amplifying transistors connected in parallel with one another between an operating power source terminal and the ground.

BRIEF DESCRIPTION OF THE DRAWINGS

The above and other aspects, features and other advantages of the present invention will be more clearly understood from the following detailed description taken in conjunction with the accompanying drawings, in which.

DETAILED DESCRIPTION OF THE PREFERRED EMBODIMENT

Exemplary embodiments of the present invention will now be described in detail with reference to the accompanying drawings.

Figure 2:
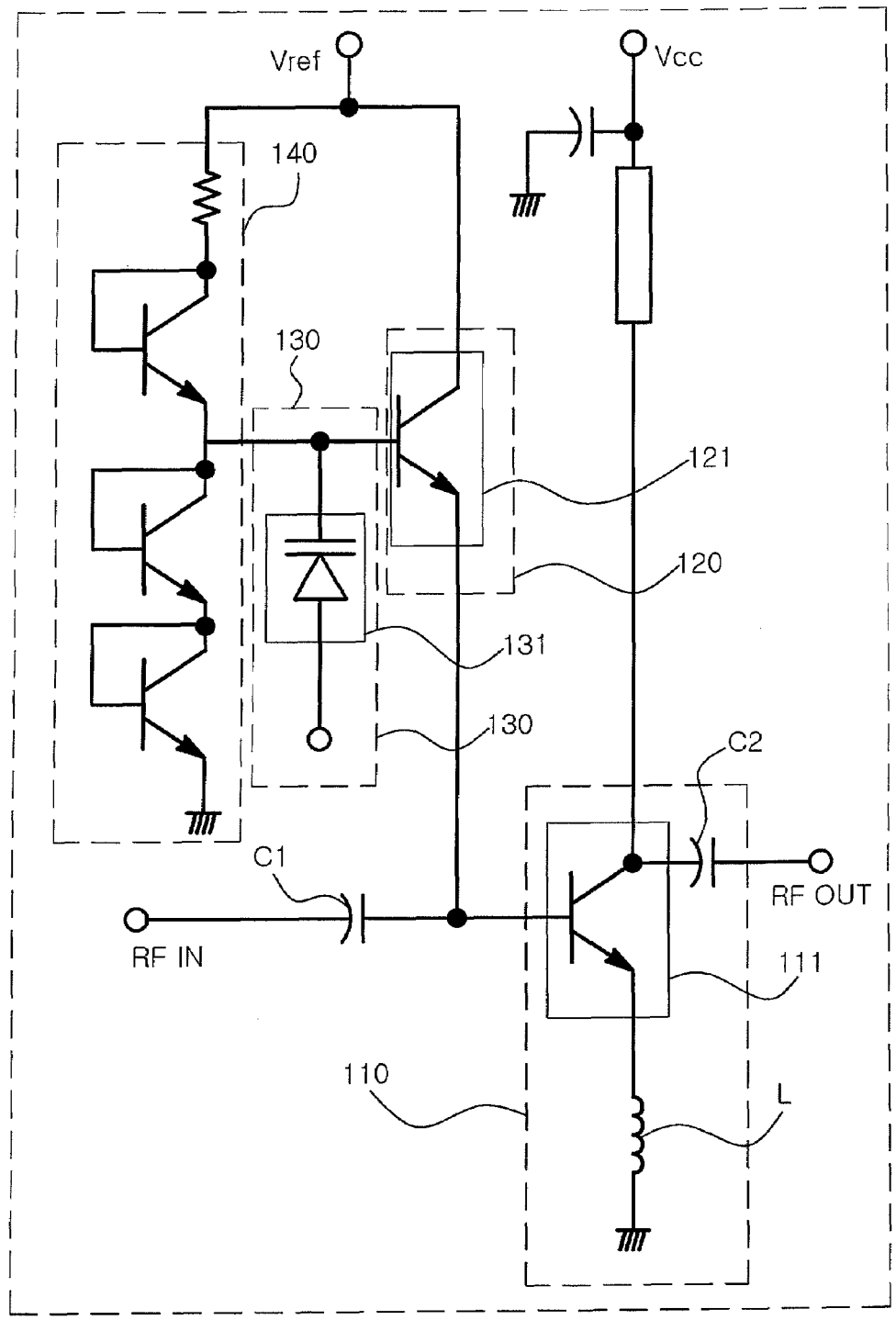
FIG. 2 is a circuit diagram illustrating a power amplifying device according to an exemplary embodiment of the invention.

FIG. 2 is a circuit diagram illustrating a power amplifying device according to an exemplary embodiment of the invention.

Referring to FIG. 2, the power amplifying device 100 of the present embodiment includes an amplifying unit 110, a bias unit 120, an impedance setting unit 130 and a current compensating unit 140.

The amplifying unit 110 includes at least one amplifying transistor 111, and the amplifying transistor 111 includes a base receiving an input signal RF IN, a collector receiving an operating power source Vcc and an emitter connected to a ground. A coupling capacitor C1 is connected in series between the base and an input signal RF IN terminal. Also, another coupling capacitor C2 is connected in series between the collector and an output signal RF OUT terminal. An inductor L is connected in series between the ground and the emitter.

The bias unit 120 includes a bias transistor 121 supplying a bias power source to the amplifying unit 110. The bias transistor 121 includes a collector receiving a preset reference voltage Vref, an emitter electrically connected to the base of the amplifying transistor 111 of the amplifying unit 110, and a base electrically connected to the impedance setting unit 130 and the current compensating unit 140.

The impedance setting unit 130 includes a varactor diode 131, and the varactor diode 131 includes an anode receiving a preset control voltage (VR) and a cathode connected to the base of the bias transistor 121 of the bias unit 120. The control voltage (VR) may be a voltage applying a reverse bias to the varactor diode 131.

The current compensating unit 140 includes a plurality of transistors connected in series with one another between the reference voltage (Vref) terminal and the ground. Some nodes of the transistors connected in series with one another are electrically connected to the base of the bias transistor 121 of the bias unit 120.

The amplifying unit 110, bias unit 120, impedance setting unit 130 and current compensating unit 140 may be formed of one monolithic microwave integrated circuit (MMIC).

Figure 3A:
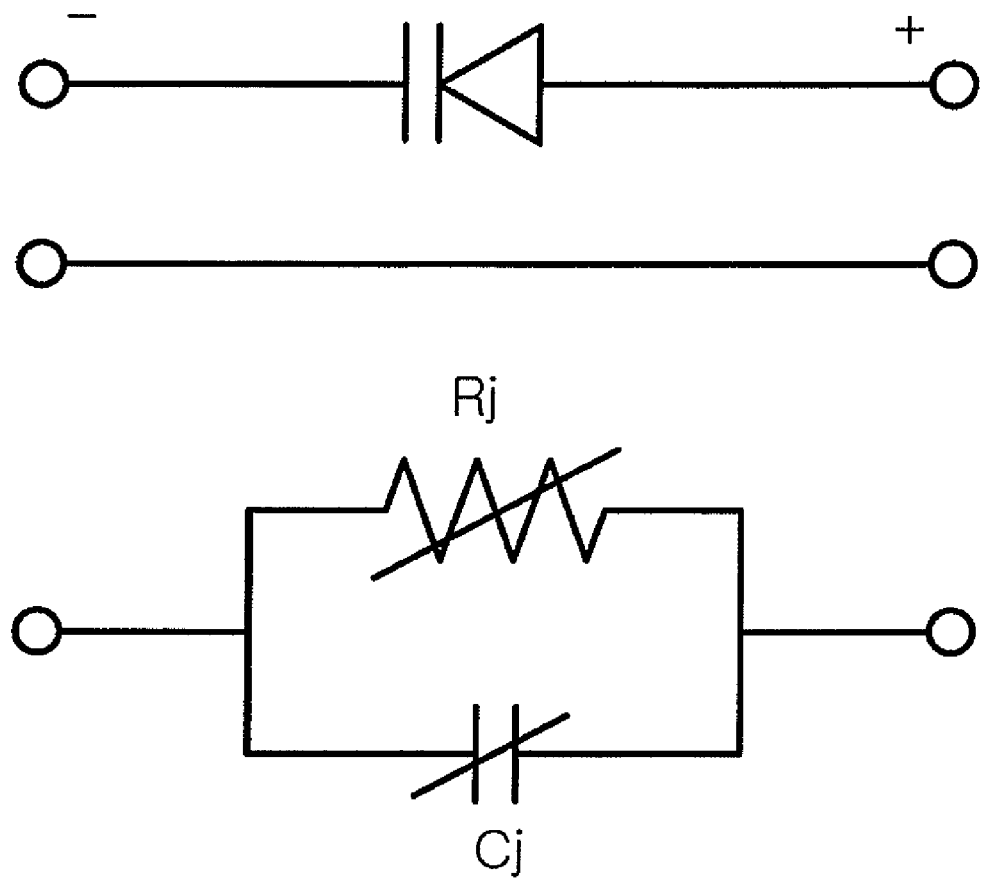
FIG. 3A is an equivalent circuit diagram of a varactor diode employed in a power amplifying device according to an exemplary embodiment of the invention.
Figure 3B:
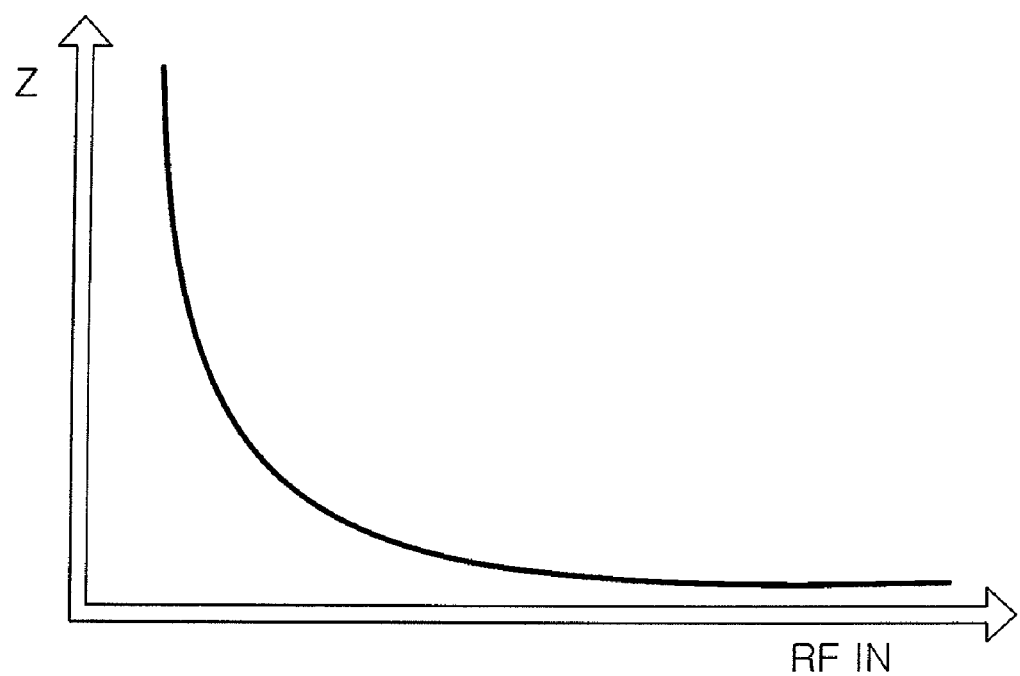
FIG. 3B is a graph illustrating electrical properties of a varactor diode shown in FIG. 3A.
Figure 3C:
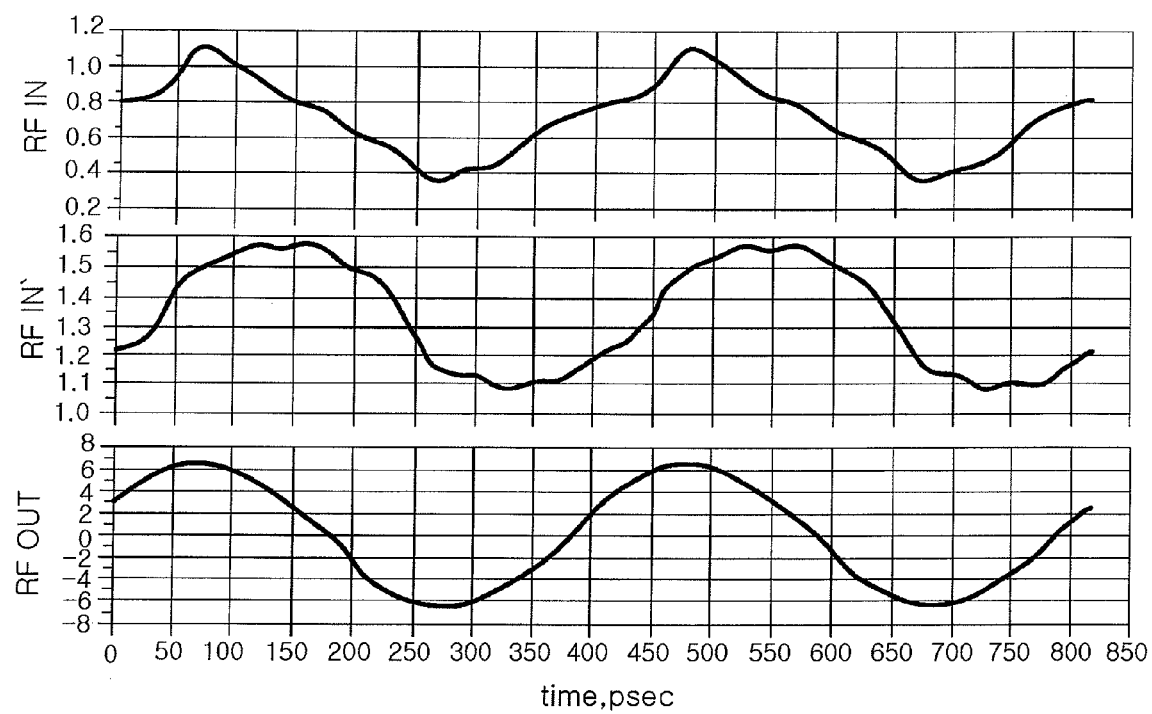
FIG. 3C is a graph illustrating an input signal, an output signal, and a portion of an input signal applied to a varactor diode.

FIG. 3A is an equivalent circuit diagram of a varactor diode employed in a power amplifying device according to an exemplary embodiment of the invention. FIG. 3B is a graph illustrating electrical properties of a varactor diode shown in FIG. 3A. FIG. 3C is a graph illustrating an input signal, an output signal, and a portion of an input signal applied to a varactor diode.

FIGS. 3A to 3C show electrical properties of the varactor diode employed in the power amplifying device of the present invention.

Figure 4A:
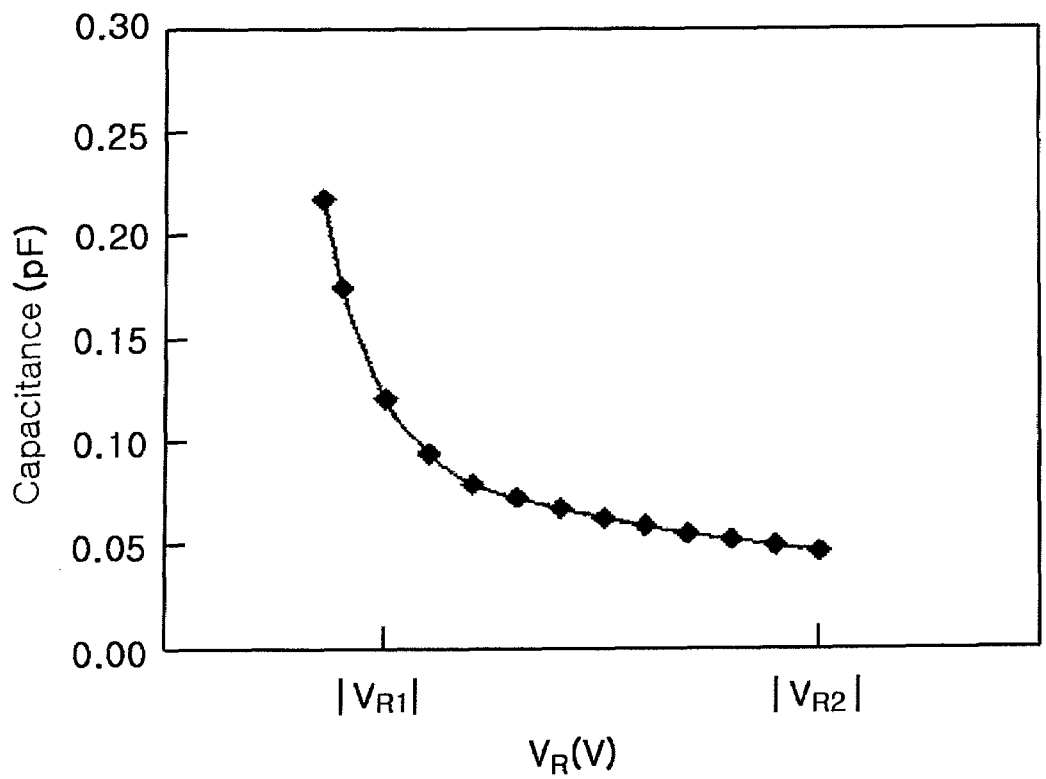
FIG. 4A is a graph illustrating initial capacitance with respect to a control voltage applied to a varactor diode employed in a power amplifying device of the present invention.

FIG. 4A is a graph illustrating initial capacitance with respect to a control voltage applied to a varactor diode employed in a power amplifying device of the present invention.

Figure 1A:
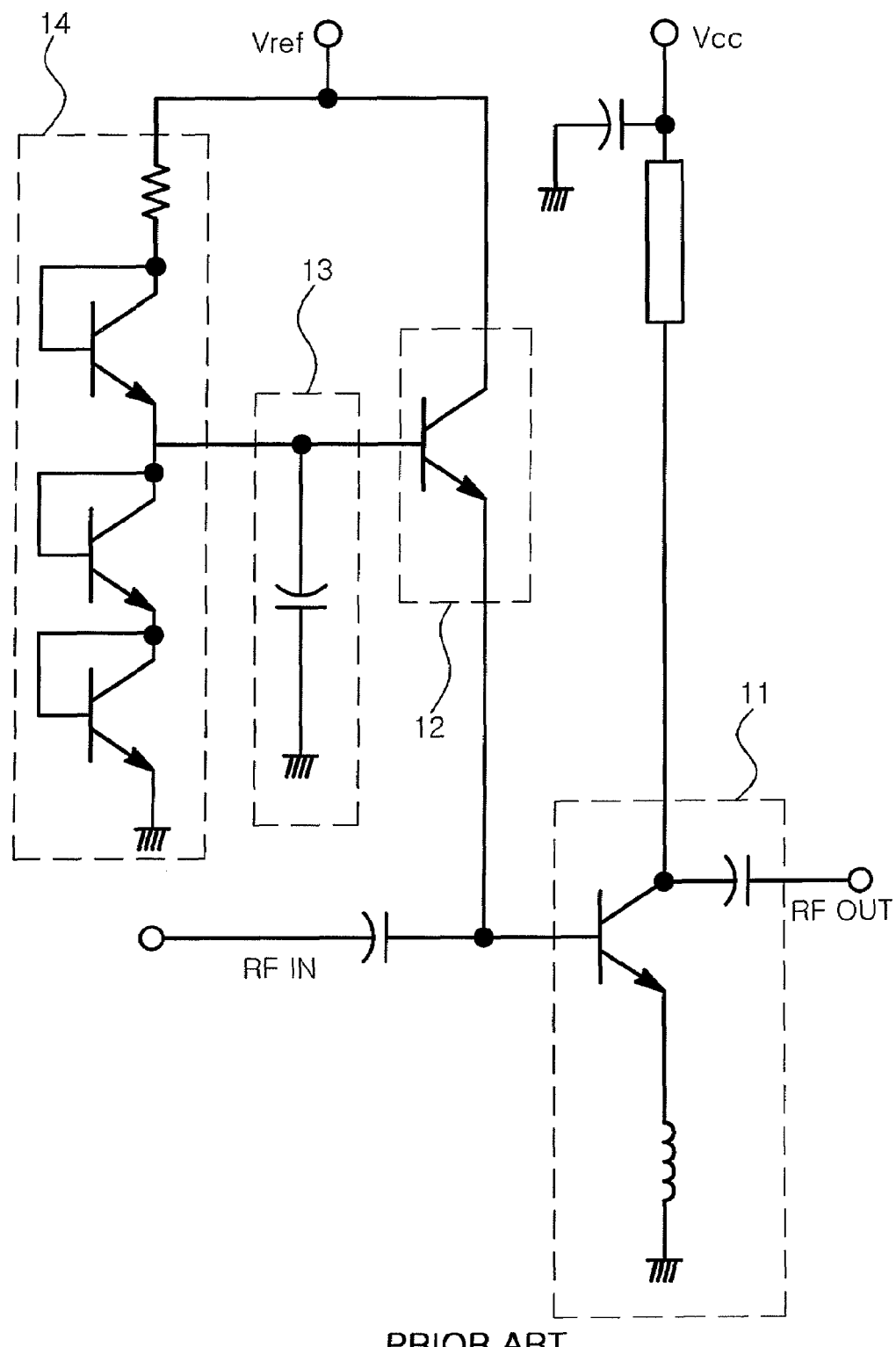
FIG. 1A is a circuit diagram illustrating an example of a conventional power amplifying device.
Figure 1B:
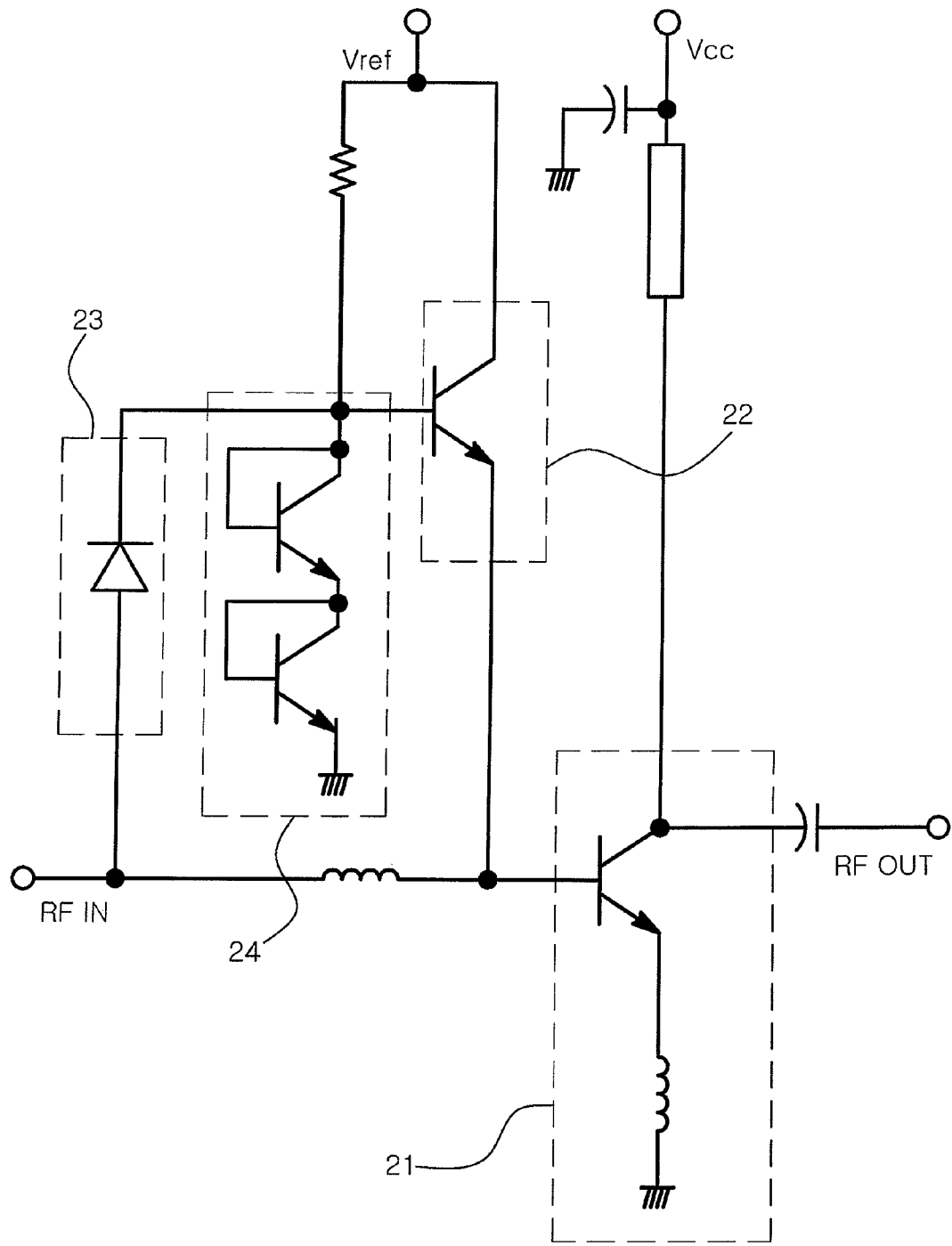
FIG. 1B is a circuit diagram illustrating another example of a conventional power amplifying device.
Figure 4B:
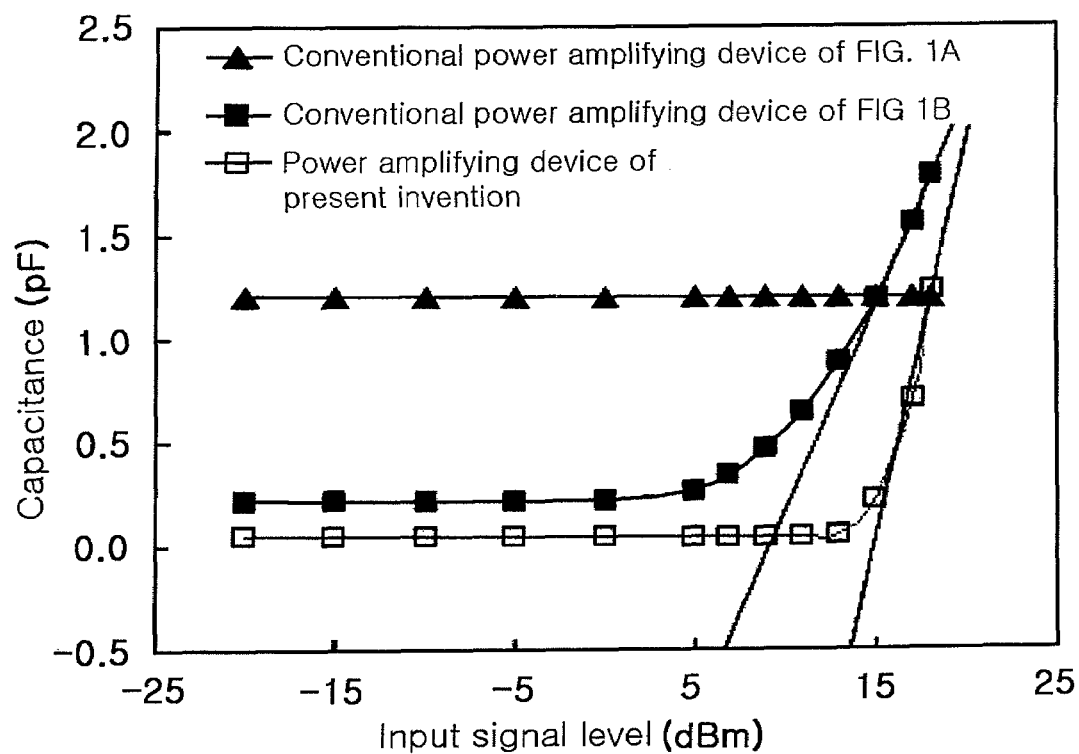
FIG. 4B is a graph illustrating capacitance of a conventional power amplifying device shown in FIG. 1A, a conventional power amplifying device shown in FIG. 1B and a power amplifying device of the present invention, respectively.

FIG. 4B is a graph illustrating capacitance of a conventional power amplifying device shown in FIG. 1A, a conventional power amplifying device shown in FIG. 1B and a power amplifying device of the present invention, respectively.

FIGS. 4A to 4B show that capacitance is varied according to electrical properties of a varactor diode employed in the power amplifying device of the present invention.

Figure 5A:
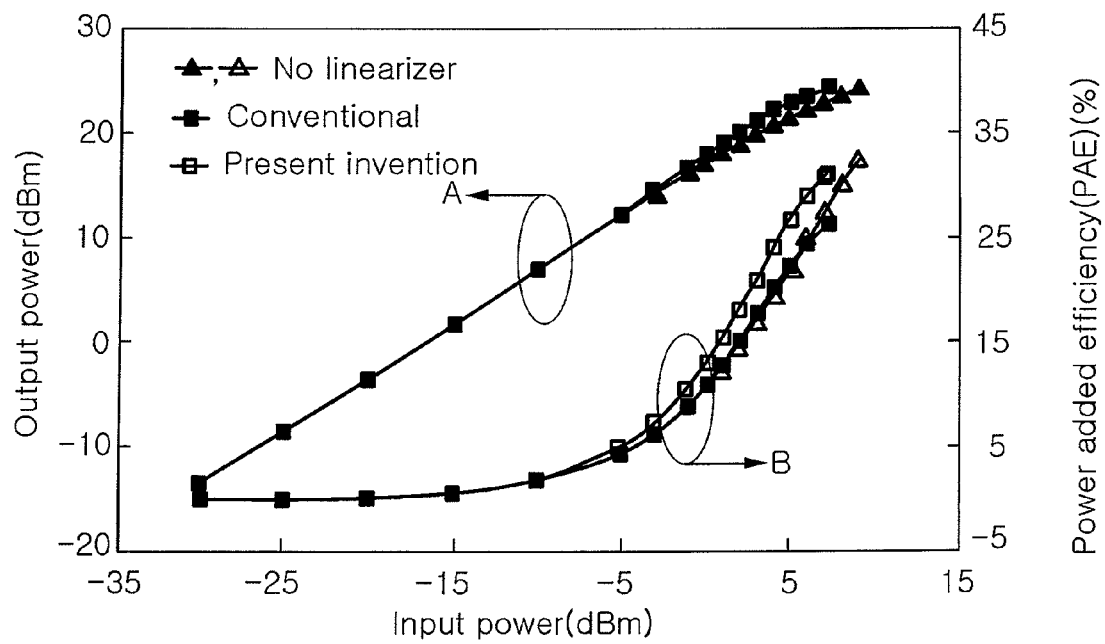
FIG. 5A is a graph illustrating output and efficiency characteristics with respect to input in a conventional power amplifying device shown in FIG. 1B and a power amplifying device of the present invention, respectively.
Figure 5B:
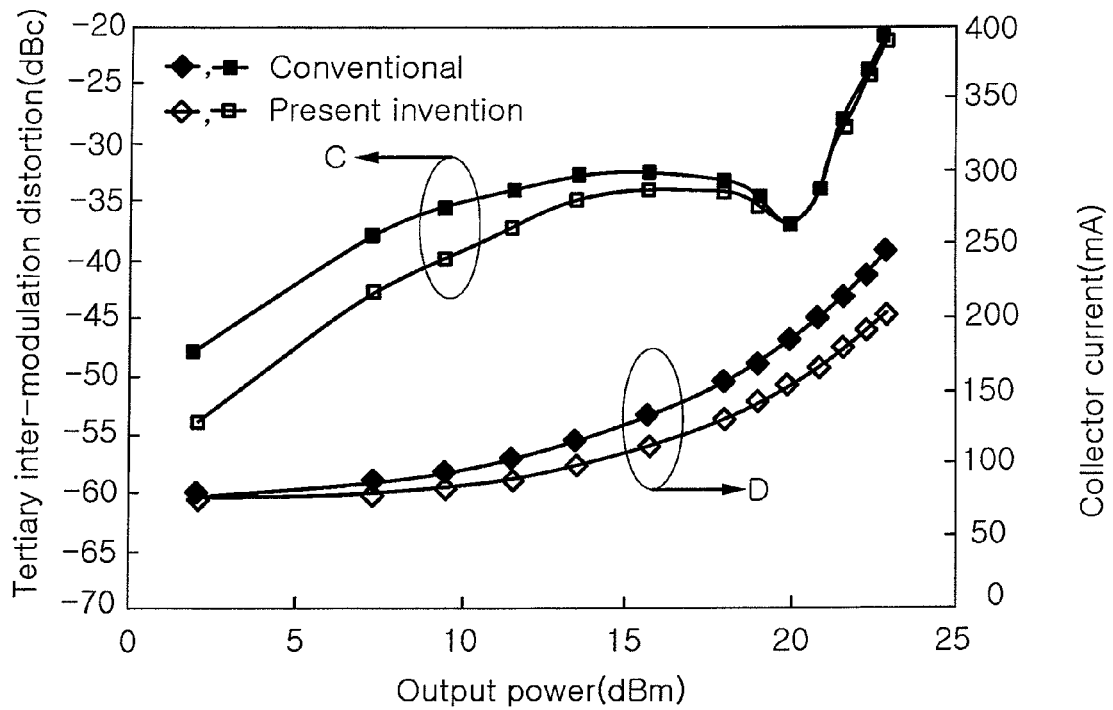
FIG. 5B is a graph illustrating tertiary inter-modulation distortion characteristics of a conventional power amplifying device shown in FIG. 1B and a power amplifying device of the present invention.

FIG. 5A is a graph illustrating output and efficiency characteristics with respect to input of a conventional power amplifying device shown in FIG. 1B and a power amplifying device of the present invention, respectively. FIG. 5B is a graph illustrating tertiary inter-modulation distortion characteristics of a conventional power amplifying device shown in FIG. 1B and a power amplifying device of the present invention, respectively.

FIGS. 5A and 5B show P1 dB and tertiary inter-modulation distortion characteristics of the power amplifying device of the present invention, compared to a conventional one.

Figure 6:
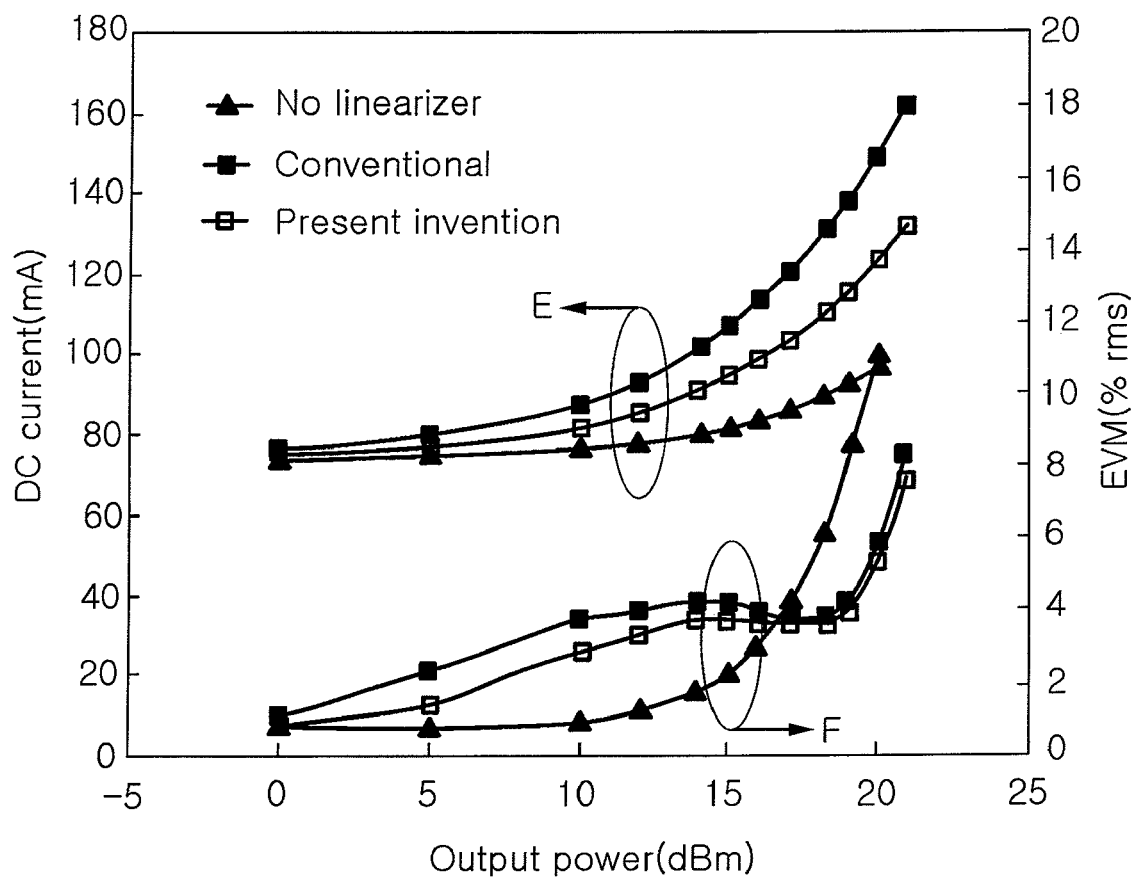
FIG. 6 is a graph illustrating error vector magnitude (EVM) and direct current (DC) characteristics of a conventional power amplifying device without a linearizer, a conventional power amplifying device shown in FIG. 1B, and a power amplifying device of the present invention when an input signal based on IEEE 802.11g standard is applied thereto, respectively.

FIG. 6 is a graph illustrating error vector magnitude (EVM) and direct current (DC) characteristics of a conventional power amplifying device without a linearizer, a conventional power amplifying device shown in FIG. 1B, and a power amplifying device of the present invention when an input signal based on IEEE 802.11g standard is applied thereto, respectively.

FIG. 6 shows the EVM value measured when an input signal based on IEEE 802.11g standard is applied and the DC consumed during operation, in a case where the power amplifying device without the linearizer, the conventional power amplifying device of FIG. 1B and the power amplifying device of the present invention are applied to a wireless lan for use in wireless telecommunication, respectively.

Hereinafter, operational effects of the present embodiment will be described in detail with reference to drawings.

Referring to FIG. 2, first, a preset operating power source Vcc is supplied to the amplifying transistor 111 and a preset reference voltage Vref is applied to the bias transistor 121 and the current compensating unit 140, respectively. For example, the operating power source Vcc may have a voltage level set to 3.3V and the reference voltage Vref may be set to 2.6V.

Thereafter, a preset control voltage VR is applied to an anode terminal of the varactor diode 131 to set an impedance of the bias transistor 121 of the bias unit 120. For example, the control voltage VR may be set to 0V or less.

Later operations will be described after examining electrical properties of the varactor diode.

Referring to the graph of FIG. 3A, a change in capacitance is plotted with respect to the control voltage VR. That is, a higher absolute value of the voltage means lower capacitance. This results from electrical properties of the varactor diode 131.

Referring to FIG. 3A, the varactor diode 131 is considered to be formed of a resistor Rj and a capacitor Cj equivalently connected in parallel with each other. The resistor Rj and capacitor Cj have resistance and capacitance varied, respectively, and the varied resistance and capacitance can be combined into impedance. FIG. 3B shows a relationship between an impedance Z and a level of the input signal RF IN. That is, a higher level of the input signal (RF IN) means a lower impedance Z.

Specifically, when the input signal RF IN has a low level, the varactor diode 131 is increased in impedance Z and substantially electrically open so that the input signal RF IN is hardly applied to the varatctor diode. On the other hand, when the input signal RF IN has a high level, the varactor diode 131 is decreased in impedance Z and substantially electrically shorted so that the input signal RF IN is sufficiently applied to the varactor diode 131.

FIG. 3C plots the input signal RF IN applied to the amplifying unit 110 and the output signal RF OUT amplified through the amplifying unit 110. In addition, a portion RF IN of the input signal applied to the amplifying unit 110 is applied to the varactor diode.

Figure 3D:
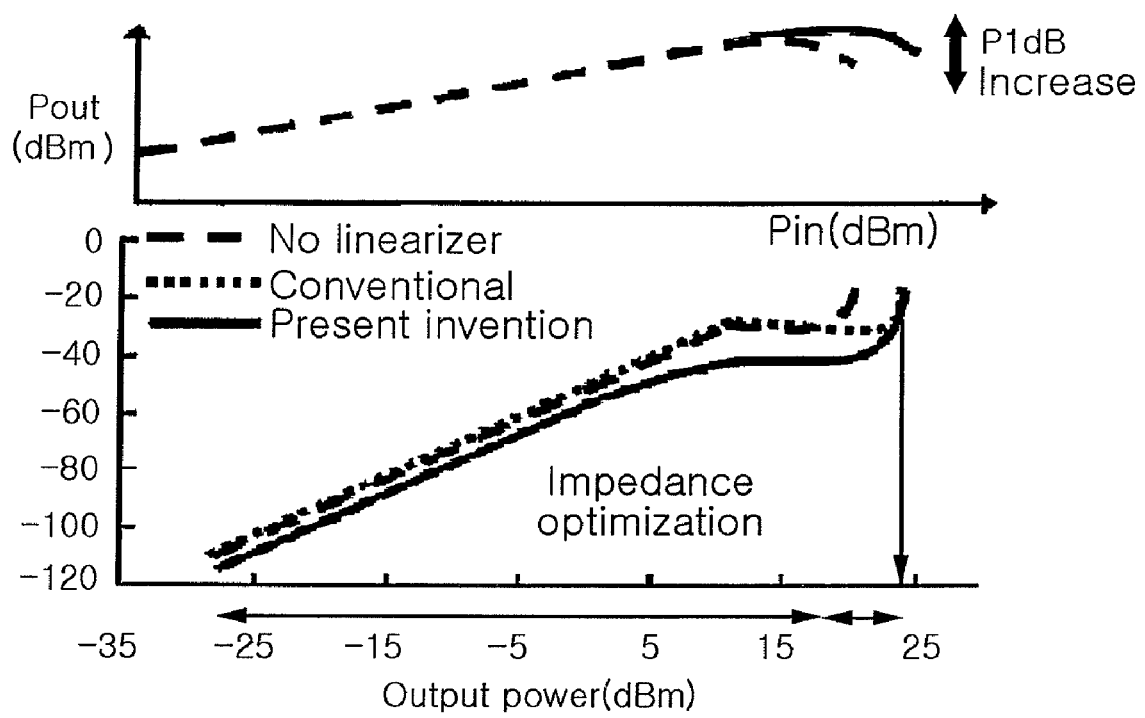
FIG. 3D is a graph illustrating P1 dB characteristics and tertiary inter-modulation distortion characteristics in response to power of an output signal from a power amplifying device without a linearizer, a conventional amplifying device shown in FIG. 1B and a power amplifying device of the present invention, respectively.

Referring to FIG. 3D, a graph in an upper part shows that the power amplifying device with a linearizer is improved in P1 dB over the power amplifying device without a linearizer. A graph in a lower part shows that the power amplifying device of the present embodiment is improved in inter-modulation distortion in a low output region having an output power of 16 and 17 dBm or less and in a high output region having an output power of 16 and 17 dBm or more, over the power amplifying device without the linearizer and the power amplifying device shown in FIG. 1B.

Going back to the description of the power amplifying device 100, the input signal RF IN is applied to the base of the amplifying transistor 111 of the amplifying unit 110 through an input signal terminal. For example, the input signal RF IN may have a level ranging from −30 dBm to 20 dBm. Moreover, the amplifying transistor 111 may include a plurality of transistors connected in parallel with one another between the operating power source Vcc and the ground to facilitate amplification of the input signal.

As described above, the varactor diode 131 includes a variable resistor and a variable capacitor equivalently, and has an initial impedance set in response to the control voltage VR. Here, the initial impedance may be set to a great value by increasing resistance and decreasing capacitance.

FIG. 4B shows capacitance with respect to the input signal of the power amplifying device of the present invention in view of the conventional power amplifying devices shown in FIGS. 1A and 1B. As shown in the graph of FIG. 4B, the power amplifying device of the present embodiment employing the varactor diode can have a capacitance set lower with respect to a level of the input signal, compared with the conventional power amplifying device. Accordingly, the output signal can be improved in linearity in a low level region of the input signal.

Meanwhile, a majority of the input signal RF IN is applied to the amplifying transistor 111 and amplified. But a portion of the input signal RF IN is applied to an emitter of the bias transistor 121 and the portion of the input signal applied to the emitter is applied to a cathode of the varactor diode 131 through the base of the bias transistor 121.

Accordingly, the varactor diode 131 has the impedance varied according to a level of the input signal RF IN. That is, a higher level of the input signal RF IN leads to a lower impedance of the varactor diode 131. Thus, a great portion of the input signal RF IN is applied to the varactor diode 131. On the other hand, a lower level of the input signal RF IN leads to a higher impedance of the varactor diode 131. Thus, a small portion of the input signal RF IN is applied to the varactor diode 131.

Accordingly, the bias transistor 121 of the bias unit 120 receives the reference voltage Vref and supplies a bias power source to the amplifying transistor 111 of the amplifying unit 110. As described above, with increase in impedance, the applied DC is lowered in response to the bias power source. In turn, the amplifying transistor 111 amplifies the input signal RF IN at a low amplification rate. On the contrary, with decrease in the impedance, the applied DC is increased in response to the bias power source. In turn, the transistor 111 amplifies the input signal RF IN at a high amplification rate. That is, the impedance is re-set according to a level of the input signal RF IN and the bias power source is varied according to the impedance. This accordingly varies the amplification rate, and thus the amplifying transistor 111 linearly amplifies the input signal RF IN and outputs an output signal RF OUT.

In addition, the current compensating unit 140 supplies a preset current to the bias unit 120 regardless of ambient factors such as temperature.

Referring to FIG. 5A, the conventional power amplifying device of FIG. 1B and the power amplifying device of the present embodiment are not different in terms of P1 Db. Also, the conventional power amplifying device and the power amplifying device of the present invention adopt the linearizer, respectively and are improved in P1 dB over the power amplifying device without the linearizer, as indicated with A in FIG. 5A. Also, the power amplifying device of the present invention, the conventional power amplifying device and the power amplifying device without the linearizer exhibits, in their order, higher power added efficiency, as indicated with B of FIG. 5A.

In the meantime, referring to FIG. 5B, the power amplifying device of the present embodiment is not different from the conventional power amplifying device shown in FIG. 1B in terms of P1 dB. But the power amplifying device of the present embodiment is noticeably improved in tertiary inter-modulation distortion by 0.2 to 6 dB in a low output region where the input signal has a level ranging from 2 dBm to 18 dBm, as indicated with C of FIG. 5B. Moreover in the power amplifying device of the present embodiment, the amplifying transistor of the amplifying unit consumes less collector current, as indicated with D of FIG. 5B.

This is because the control voltage VR is applied to the varactor diode 131 when the bias unit 12 is initially operated, thereby setting the initial impedance of the varactor diode to a great value.

Referring to FIG. 6, the input signal based on IEEE 802.11g standard is applied to the power amplifying device without the linearizer, the conventional power amplifying device of FIG. 1B, and the power amplifying device of the present embodiment, respectively. The error vector magnitude (EVM) value measured denotes linearity and thus a lower EVM value means superior linearity.

The power amplifying device without the linearizer consumes less DC, i.e., collector current of the amplifying transistor, as indicated with E of FIG. 6, but exhibits a very high EVM value in a high output region where the output signal power is at least 16 or 17 dBm, as indicated with F of FIG. 6. This significantly increases tertiary inter-modulation distortion, thus rendering the power amplifying device without the linearizer hardly applicable to a wireless lan.

In addition, the conventional power amplifying device of FIG. 1B demonstrates a lower EVM value in the high output region than the power amplifying device without the linearizer but consumes more DC.

In the meantime, the power amplifying device of the present embodiment consumes less DC than the conventional power amplifying device, and exhibits a low EVM value across the lower output region and high output region of the output signal, i.e., low-level region and high-level region of the input signal. Accordingly, the power amplifying device of the present embodiment is improved in inter-modulation distortion in both the low output region and high output region of the output signal power, i.e., low level and high level region of the input signal, thereby ensuring linearity.

As set forth above, according to exemplary embodiments of the invention, a bias circuit has an impedance set through a control voltage when initially operated, thereby ensuring linearity of an output signal in a wide range of an input signal. Notably, the power amplifying device sufficiently improves tertiary inter-modulation distortion in a low level region of the input signal.

While the present invention has been shown and described in connection with the exemplary embodiments, it will be apparent to those skilled in the art that modifications and variations can be made without departing from the spirit and scope of the invention as defined by the appended claims.

What is claimed is:

1. A power amplifying device having a linearizer comprising:
    an amplifying unit receiving a bias voltage and amplifying an input signal;
    a bias unit varying the bias voltage according to a set impedance to provide to the amplifying unit; and
    an impedance setting unit setting the impedance of the bias unit to a high level in response to a preset control voltage when the bias unit is initially operated and re-setting the impedance of the bias unit according to a level of the input signal of the amplifying unit after initial operation of the bias unit.

2. The power amplifying device of claim 1, further comprising a current compensating unit supplying a preset current to the bias unit.

3. The power amplifying device of claim 2, wherein the amplifying unit comprises at least one amplifying transistor comprising a base receiving the input signal and the bias power source, a collector receiving an operating power source and an emitter connected to a ground,
    the bias unit comprises a bias transistor comprising a collector receiving a preset reference voltage, an emitter connected to the base of the amplifying transistor to supply the bias power source to the amplifying transistor, and a base connected to the current compensating unit, and
    the impedance setting unit comprises a varactor diode comprising a cathode connected to the base of the bias transistor and an anode receiving the control voltage, the impedance setting unit setting the impedance applied to the base of the bias transistor.

4. The power amplifying device of claim 3, wherein the control voltage is a voltage applying a reverse bias to the varactor diode.

5. The power amplifying device of claim 4, wherein the current compensating unit comprises a plurality of transistors connected in series with one another between a reference voltage terminal and the ground.

6. The power amplifying device of claim 3, wherein the amplifying unit comprises the plurality of amplifying transistors connected in parallel with one another between an operating power source terminal and the ground.

* * * * *